(12) United States Patent
Kim et al.

(10) Patent No.: US 7,760,824 B2
(45) Date of Patent: Jul. 20, 2010

(54) ELIMINATION OF DC OFFSET IN ANALOG BASEBAND CIRCUIT WITH MINIMIZED TRANSIENTS

(75) Inventors: Jae-Wan Kim, Suwon-si (KR); Young-Jin Kim, Yongin-si (KR); Jae-Heon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 715 days.

(21) Appl. No.: 11/788,411

(22) Filed: Apr. 20, 2007

(65) Prior Publication Data

US 2007/0259638 A1 Nov. 8, 2007

(30) Foreign Application Priority Data

May 6, 2006 (KR) .............. 10-2006-0040784

(51) Int. Cl.
*H04L 27/08* (2006.01)
(52) U.S. Cl. .............. 375/345; 455/130; 455/232.1
(58) Field of Classification Search .......... 375/224, 375/316, 319, 345; 455/130, 226.1, 230, 455/232.1, 234.1, 245.1, 251.1; 330/310, 330/75, 85
See application file for complete search history.

(56) References Cited

U.S. PATENT DOCUMENTS

| | | | | |
|---|---|---|---|---|
| 4,030,035 A | * | 6/1977 | Ienaka et al. | 455/237.1 |
| 5,422,889 A | * | 6/1995 | Sevenhans et al. | 370/442 |
| 5,724,653 A | * | 3/1998 | Baker et al. | 455/296 |
| 6,240,100 B1 | | 5/2001 | Riordan et al. | 370/442 |
| 6,628,731 B2 | * | 9/2003 | Auranen et al. | 375/345 |
| 6,697,611 B1 | * | 2/2004 | Franca-Neto | 455/296 |
| 7,136,431 B2 | * | 11/2006 | Shi et al. | 375/319 |
| 7,231,195 B2 | * | 6/2007 | Nakayama | 455/251.1 |
| 7,233,780 B2 | * | 6/2007 | Franca-Neto | 455/296 |
| 7,260,373 B2 | * | 8/2007 | Akamine et al. | 455/234.1 |
| 7,277,688 B2 | * | 10/2007 | Yang et al. | 455/296 |
| 7,376,405 B2 | * | 5/2008 | Kurimoto et al. | 455/232.1 |
| 7,433,431 B2 | * | 10/2008 | Birkett | 375/345 |
| 7,469,134 B2 | * | 12/2008 | Yoshizawa et al. | 455/234.2 |

OTHER PUBLICATIONS

Japanese Patent Application No. 2002-221233 to Toshito et al., having Publication date of Feb. 26, 2004 (w/ English Abstract page).
Japanese Patent Application No. 2002-228187 to Yoshio, having Publication date of Mar. 4, 2004 (w/ English Abstract page).
Japanese Patent Application No. 2003-342874 to Ikuya, having Publication date of Apr. 21, 2005 (w/ English Abstract page).

* cited by examiner

*Primary Examiner*—Jean B Corrielus
(74) *Attorney, Agent, or Firm*—Monica H. Choi

(57) ABSTRACT

An analog baseband circuit includes first and second DC (direct current) offset cancellers and an offset canceller controller. The first DC offset canceller includes a first filter and a first PGA (programmable gain amplifier) with a first gain step for eliminating a first dc component from an input baseband signal. The second DC offset canceller includes a second filter and a second PGA with a second gain step less than the first gain step for eliminating a second dc component from an output of the first DC offset canceller. The offset canceller controller controls the first and second filters to operate in a fast mode when a gain of the first PGA is changed.

20 Claims, 6 Drawing Sheets

ELIMINATION OF DC OFFSET IN ANALOG BASEBAND CIRCUIT WITH MINIMIZED TRANSIENTS

BACKGROUND OF THE INVENTION

This application claims priority under 35 USC §119 to Korean Patent Application No. 2006-40784, filed on May 6, 2006 in the Korean Intellectual. Property Office, the disclosure of which is incorporated herein in its entirety by reference.

1. Field of the Invention

The present invention relates generally to analog baseband circuits such as used in direct conversion receivers, and more particularly, to elimination of DC offset in an analog baseband circuit with minimized transients for preserving signal integrity.

2. Background of the Invention

Direct conversion receivers, such as Wideband Code Division Multiple Access (WCDMA) receivers, continuously receive signals during communications. Such receivers usually remove a DC offset using high pass filtering such as AC coupling or DC feedback loop. However in most modulations, significant information is positioned near DC such that a −3 dB frequency of a high pass filter should be set to be as low as possible to prevent signal quality from decreasing. On the other hand, a low cutoff frequency prolongs the time for removing a rapidly and quickly changing DC offset. Accordingly, high pass filtering is not appropriate for removing a rapidly and quickly changing DC offset.

The rapidly and quickly changing DC offset may occur when a gain of an analog baseband circuit is changed in stages by a digitally controlled programmable gain amplifier (PGA). With prolonged time for removing the DC offset, a large-step transient that attenuates slowly occurs in a receiver output signal. A transient may deteriorate signal quality or saturate a back-end (e.g., a modem) of a receiver.

Methods of quickly attenuating a transient by increasing a cutoff frequency in an instant when a gain changes have been introduced by P. M. Stroet et al. ["A Zero-IF Single-Chip Transceiver for up to 22 Mb/s QPSK 802.11b Wireless LAN", IEEE International Solid-State Circuit Conference Digest of Technical Papers, February 2001, pp. 204-205] and W. Schelembauer et al. ["Analog BaseBand Chain for a UMTS Zero-IF Receiver in a 75 GHz SiGe BiCMOS Technology", IEEE Radio Frequency Integrated Circuits Symposium Digest of Papers, May 2002, pp. 267-270].

However in these conventional methods, since the cutoff frequency is increased at the instant when a gain changes, signal quality may be deteriorated during that short time. In particular, a bit error rate (BER) of a receiver may be increased in a multi-path fading environment in which a gain changes rapidly and quickly.

SUMMARY OF THE INVENTION

Accordingly, the cutoff frequency in an analog baseband circuit of the present invention is increased only when the gain of a PGA (programmable gain amplifier) with a largest gain step is changed.

An analog baseband circuit according to an aspect of the present invention includes first and second DC (direct current) offset cancellers and an offset canceller controller. The first DC offset canceller includes a first filter and a first PGA (programmable gain amplifier) with a first gain step for eliminating a first dc component from an input baseband signal. The second DC offset canceller includes a second filter and a second PGA with a second gain step less than the first gain step for eliminating a second dc component from an output of the first DC offset canceller. The offset canceller controller controls the first and second filters to operate in a fast mode when a gain of the first PGA is changed.

In an embodiment of the present invention, the first DC offset canceller includes a first feed-back loop with a first low-pass filter, a first feed-back amplifier, and a first subtractor. The first low-pass filter is for low-pass filtering a first PGA output according to a first cut-off frequency to generate a first filtered output. The first feed-back amplifier amplifies the first filtered output. The first subtractor subtracts the amplified first filtered output from the input baseband signal to generate a first DC offset cancelled baseband signal. The first PGA amplifies the first DC offset cancelled baseband signal with a first PGA gain to generate the first PGA output.

In a further embodiment of the present invention, the second DC offset canceller includes a second feed-back loop with a second low-pass filter, a second feed-back amplifier, and a second subtractor. The second low-pass filter is for low-pass filtering a second PGA output according to a second cut-off frequency to generate a second filtered output. The second feed-back amplifier amplifies the second filtered output. The second subtractor subtracts the amplified second filtered output from a form of the first PGA output to generate a second DC offset cancelled baseband signal. The second PGA amplifies the second DC offset cancelled baseband signal with a second PGA gain to generate the second PGA output.

In an example embodiment of the present invention, the offset canceller controller increases the first and second cut-off frequencies of the first and second low-pass filters when the first PGA gain is changed.

The analog baseband circuit according to another embodiment of the present invention further includes a gain controller for setting the first and second PGA gains according to an n-bit gain control code. In a further embodiment of the present invention, the gain controller sets the first and second PGA gains to obtain a respective gain overlap near each end of a gain band for the first PGA in a gain characteristic of the analog baseband circuit. In that case, the gain controller sets the first and second PGA gains according to a hysteresis defined by the respective gain overlap near each end of a gain band for the first PGA.

In an example embodiment of the present invention, a subset of at least one most significant bit of the n-bit gain control code determines the first PGA gain, and the offset canceller controller includes a respective initial trigger for generating a respective trigger pulse when a respective one of the subset of the n-bits changes. In that case, the offset canceller controller further includes a mono-stable trigger for generating a fast mode pulse from any respective trigger pulse such that the first and second low-pass filters operate with an increase of the first and second cut-off frequencies during the fast mode pulse.

In a further embodiment of the present invention, the analog baseband circuit further includes another low-pass filter coupled between the first and second low-pass filters for low-pass filtering the first PGA output to generate a filtered first PGA output to the second subtractor that subtracts the amplified second filtered output from the filtered first PGA output to generate the second DC offset cancelled baseband signal.

In another embodiment of the present invention, the analog baseband circuit also includes a third PGA with a third gain step less than the second gain step for amplifying the second PGA output to generate an output baseband signal.

The analog baseband circuit of the present invention may be used to particular advantage in a direct conversion receiver of a communications system.

In this manner, the first and second low-pass filters are controlled to operate in the fast mode only during gain change at the first PGA. Thus, the analog baseband circuit of the present invention operates in the fast mode less frequently for preserving signal integrity. In addition, the analog baseband circuit of the present invention operates in the fast mode during gain change of the first PGA with higher gain step when a larger transient is more likely to be generated.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, and 6 refer to elements having similar structure and/or function.

DETAILED DESCRIPTION OF THE INVENTION

Figure 1:
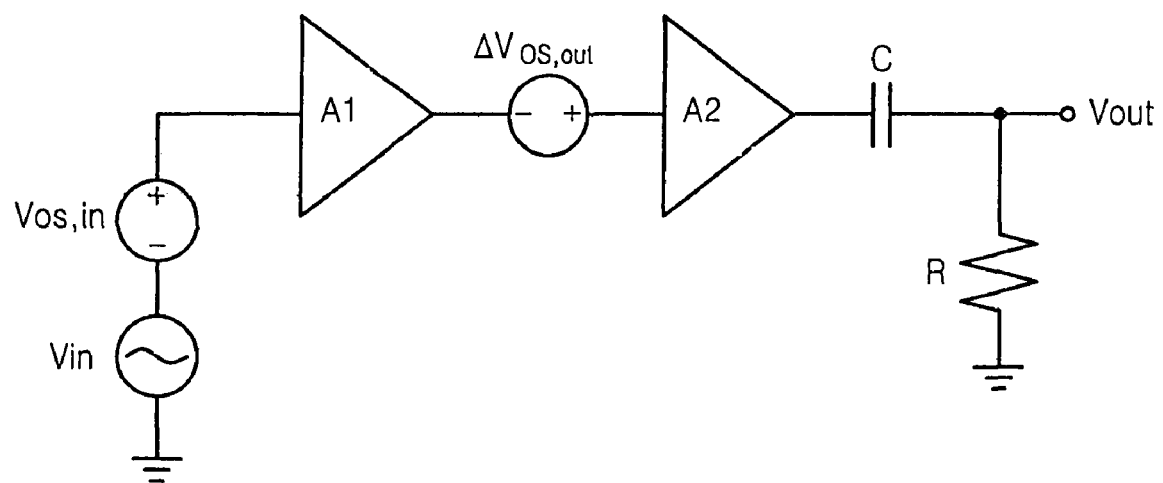
FIG. 1 shows an AC coupling circuit illustrating occurrence of a transient therein.
Figure 2:
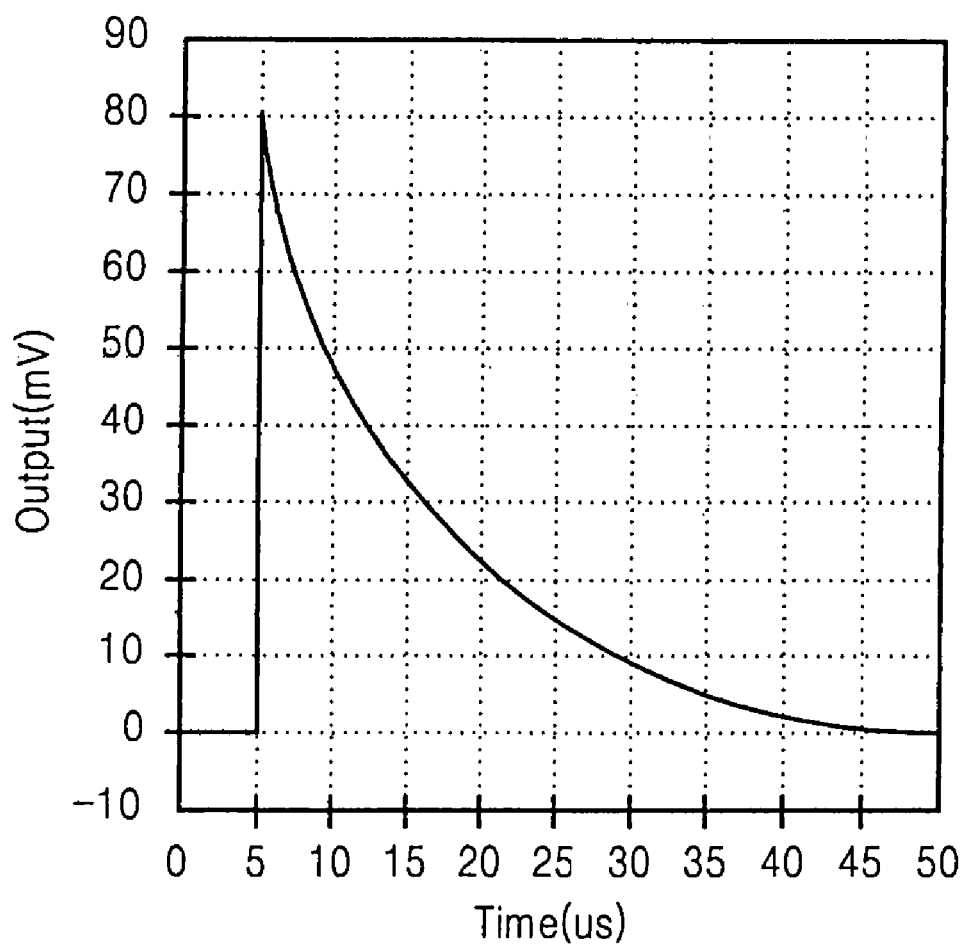
FIG. 2 is a graph of a result of simulating a transient in the AC coupling circuit of FIG. 1.

FIG. 1 shows an AC coupling circuit which includes two amplifier stages similar to analog baseband circuits of the present invention. FIG. 2 is a graph of a simulation result with a transient in the AC coupling circuit of FIG. 1. Applicants have analyzed the occurrence of such a transient in the AC coupling circuit of FIG. 1.

Referring to FIG. 1, the AC coupling circuit includes two programmable gain amplifiers (PGAs) A1 and A2 connected in series and a high pass filter formed by a capacitor C and a resistor R for AC coupling.

A transient $V_{TR}(t)$ at an output terminal Vout of the AC coupling circuit is expressed by Equation (1):

$$V_{TR}(t) = [(10^{(G1+G2)/20})(10^{\Delta G1/20}-1)V_{OS,in} + 10^{G2/20}\Delta V_{OS,out}]e^{-t/(RC)}, \quad (1)$$

$G_1$ and $\Delta G_1$ are an original voltage gain and a voltage gain variation, respectively, of the amplifier A1. $G_2$ is a voltage gain of the amplifier A2. $\Delta V_{OS,out}$ is a change of a DC offset voltage in an output of the amplifier A1. RC is a time constant of the AC coupling with R being a resistance of the resistor and C being the capacitance of the capacitor in FIG. 1. A −3 dB frequency fc for the high pass filtering of the AC coupling is expressed by $fc = 1/(2\pi RC)$.

In Equation (1), a peak of a transient appears at t=0 seconds corresponding to the moment the gain G1 changes. For example, as illustrated in FIG. 2, when $\Delta G_1$ is 3 dB, $G_1+G_2=40$ dB, and the input DC offset $V_{OS,out}$ is 2 mV, a transient has a peak value of about 80 mV. When $G_1$ and $G_2$ increase, the peak value of $V_{TR}$ also increases. The magnitude of the transient $V_{TR}$ is minimized when the amplifier A1, which is the PGA positioned at a front terminal, has a maximum gain while the amplifier A2, which is a PGA positioned at a rear terminal, has a minimum gain.

Figure 3:
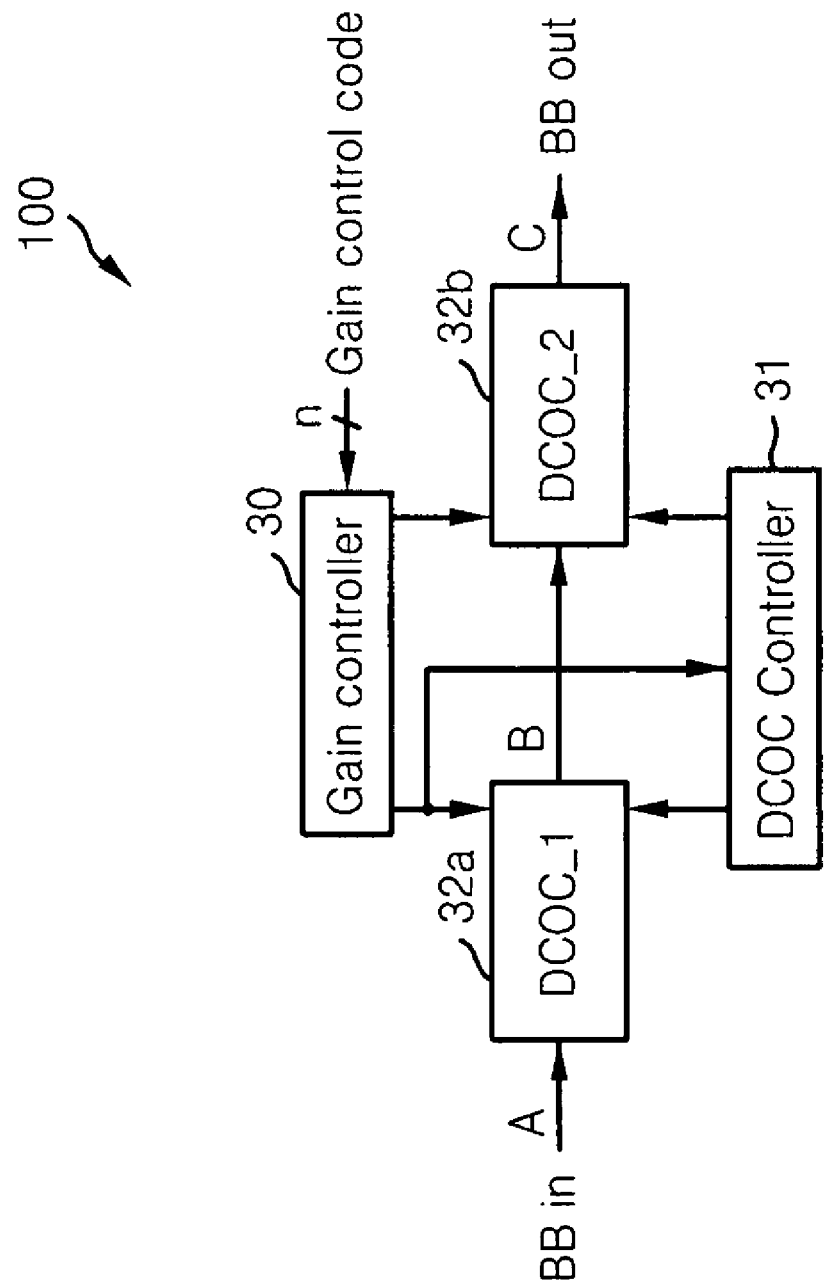
FIG. 3 is a schematic block diagram of an analog baseband circuit for a direct conversion receiver according to an embodiment of the present invention.

FIG. 3 is a schematic block diagram of an analog baseband circuit 100 for a direct conversion receiver according to an embodiment of the present invention. The analog baseband circuit 100 includes a first DC offset canceller (referred to as a DCOC_1) 32a receiving an analog input baseband signal "BB in" and eliminating a DC offset through a first feedback loop.

The analog baseband circuit 100 also includes a second DC offset canceller (referred to as a DCOC_2) 32b receiving an output of the DCOC_1 32a and eliminating a DC offset through a second feedback loop. The DCOC_1 32a and the DCOC_2 32b operate in one of a normal mode having a lower cutoff frequency or a fast mode having a higher cutoff frequency than in the normal mode. A DCOC controller 31 controls the DCOC_1 32a and the DCOC_2 32b to operate in one of the normal mode or the fast mode.

A gain controller 30 sets a first gain of the DCOC_1 32a and a second gain of the DCOC_2 32b in response to an n-bit gain control code which may be provided from a modem and specifically an automatic gain controller (AGC) of the modem for example. The first gain of the DCOC_1 32a positioned more toward the input baseband signal "BB in" is greater than the second gain of the DCOC_2 32b according to an embodiment of the present invention.

In addition, the DCOC_1 32a has a first gain step, and the DCOC_2 32b has a second gain step that is smaller than the first gain step of the DCOC_1 32a according to the present invention. A respective "gain step" refers to the smallest respective incremental possible change in gain within the DCOC_1 32a or DCOC_2 32b.

The present invention may be practiced when the analog baseband circuit 100 further includes a low pass filter (LPF) disposed at any of positions A, B, and C shown in FIG. 3. The input baseband signal "BB in" received by the DCOC_1 32a may be an output of a mixer (not shown) in a direct conversion receiver of a communications system.

Figure 4:
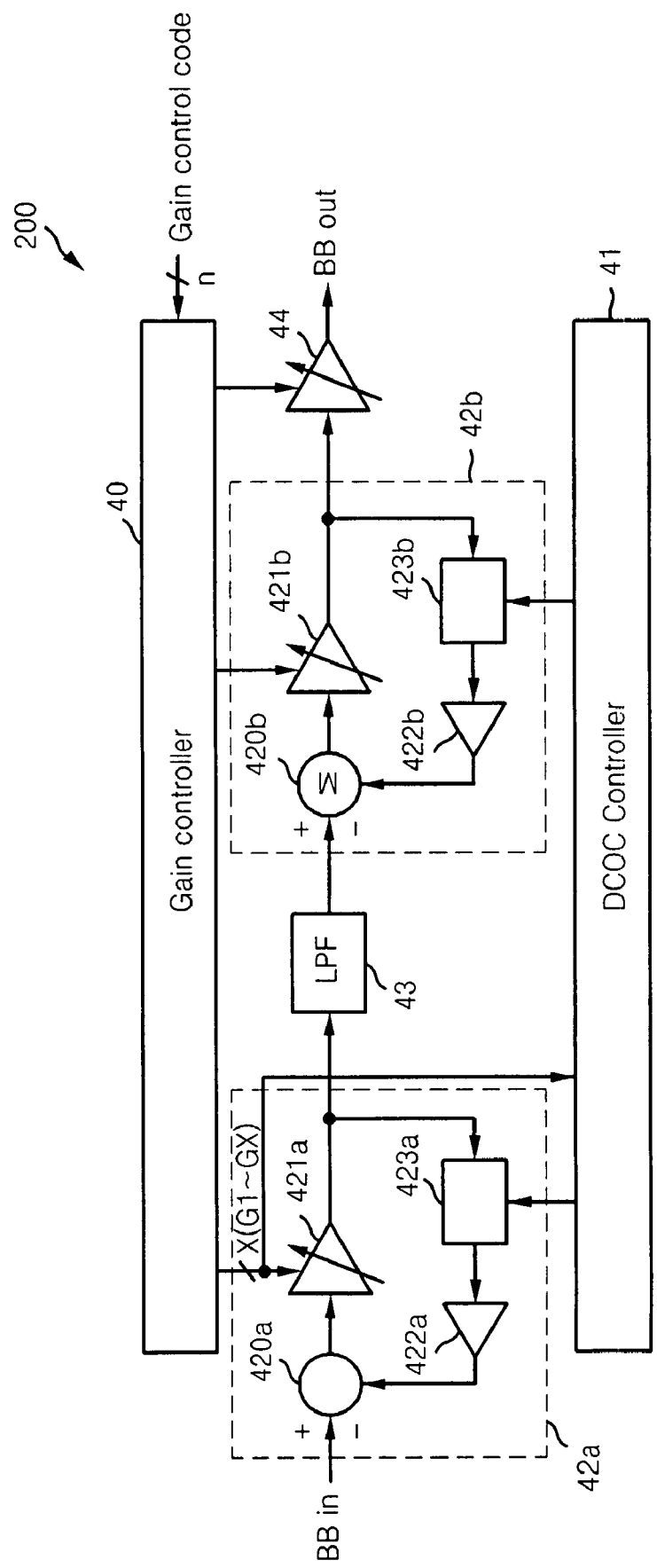
FIG. 4 is a schematic block diagram of an analog baseband circuit for a direct conversion receiver according to another embodiment of the present invention.

FIG. 4 is a block diagram of an analog baseband circuit 200 for a direct conversion receiver according to another embodiment of the present invention. The analog baseband circuit 200 includes a DCOC_1 42a receiving an analog input baseband signal "BB in" provided from a mixer (not shown) for eliminating a DC offset through a first feedback loop. The analog baseband circuit 200 also includes a DCOC_2 42b receiving an output of the DCOC_1 42a and eliminating a DC offset through a second feedback loop.

The first feedback loop of the DCOC_1 42a includes a first PGA 421a, a first low-pass filter 423a, a first feedback amplifier 422a, and a first subtractor 420a. The first low-pass filter 423a low-pass filters a first PGA output generated by the first PGA 421a according to a first cut-off frequency to generate a first filtered output. The first feed-back amplifier 422a amplifies the first filtered output.

The first subtractor subtracts the amplified first filtered output from the input baseband signal "BB in" to generate a first DC offset cancelled baseband signal. The first PGA 421a amplifies the first DC offset cancelled baseband signal with a first PGA gain to generate the first PGA output.

The second feedback loop of the DCOC_2 42b includes a second PGA 421b, a second low-pass filter 423b, a second feedback amplifier 422b, and a second subtractor 420b. The second low-pass filter 423b low-pass filters a second PGA output generated by the second PGA 421b according to a second cut-off frequency to generate a second filtered output. The second feed-back amplifier 422b amplifies the second filtered output.

The second subtractor 420b subtracts the amplified second filtered output from a filtered form of the first PGA output to generate a second DC offset cancelled baseband signal. The second PGA 421b amplifies the second DC offset cancelled baseband signal with a second PGA gain to generate the second PGA output.

The analog baseband circuit 200 of FIG. 4 includes an additional low-pass filter 43 between the DCOC_1 42a and the DCOC_2 42b. The additional low-pass filter 43 low-pass filters the first PGA output, and the filtered first PGA output is received by the second subtractor 420b that subtracts the amplified second filtered output from the filtered first PGA output to generate the second DC offset cancelled baseband signal.

Alternatively, the present invention may be practiced with an additional low-pass filter disposed before the DCOC_1 42a or after the DCOC_2 42b. Generally, the present invention may be practiced with a respective additional low-pass filter placed at a position of at least one of before the DCOC_1 42a, between the DCOC_1 42a and the DCOC_2 42b, and after the DCOC_2 42b.

A DCOC controller 41 controls the DCOC_1 42a and the DCOC_2 42b to operate in one of a normal mode or a fast mode. The first and second cut-off frequencies of the first and second low-pass filters 423a and 423b are each respectively lower during the normal mode than during the fast mode. Thus during the normal mode, the DCOC controller 41 controls the first and second cut-off frequencies of the first and second low-pass filters 423a and 423b to each be at lower values. During the fast mode, the DCOC controller 41 controls the first and second cut-off frequencies of the first and second low-pass filters 423a and 423b to each be at higher values.

A gain controller 40 sets the first PGA gain of the DCOC_1 42a and the second PGA gain of the DCOC_2 42b in response to an n-bit gain control code which may be provided from a modem and specifically an automatic gain controller (AGC) of the modem for example. The first PGA gain of the first PGA 421a positioned more toward the input baseband signal "BB in" is greater than the second PGA gain of the second PGA 421b according to an embodiment of the present invention.

In addition, the first PGA 421a has a first gain step, and the second PGA 421b has a second gain step that is smaller than the first gain step of the first PGA 421a according to the present invention. A respective "gain step" refers to the smallest respective incremental possible change in gain within the first PGA 421a or the second PGA 421b.

The analog baseband circuit 200 also includes a third PGA 44 coupled in series after the DCOC_2 42b. The third PGA 44 amplifies the second PGA output from the DCOC_2 42b with a third PGA gain to generate a baseband output signal "BB out". The third PGA gain of the third PGA 44 is less than the second PGA gain of the second PGA 421b. The third PGA gain of the third PGA 44 is also set by the gain controller 40 in response to the n-bit gain control code. In addition, the PGA 44 has a third gain step that is lower than the second gain step of the second PGA 421b.

The operation of the analog baseband circuit 200 is now described. The gain controller 40 receives the n-bit gain control code and sets the first PGA gain of the first PGA 421a, the second PGA gain of the second PGA 421b, and the third PGA gain of the third PGA 44 according to a gain characteristic 600 of FIG. 6.

Figure 6:
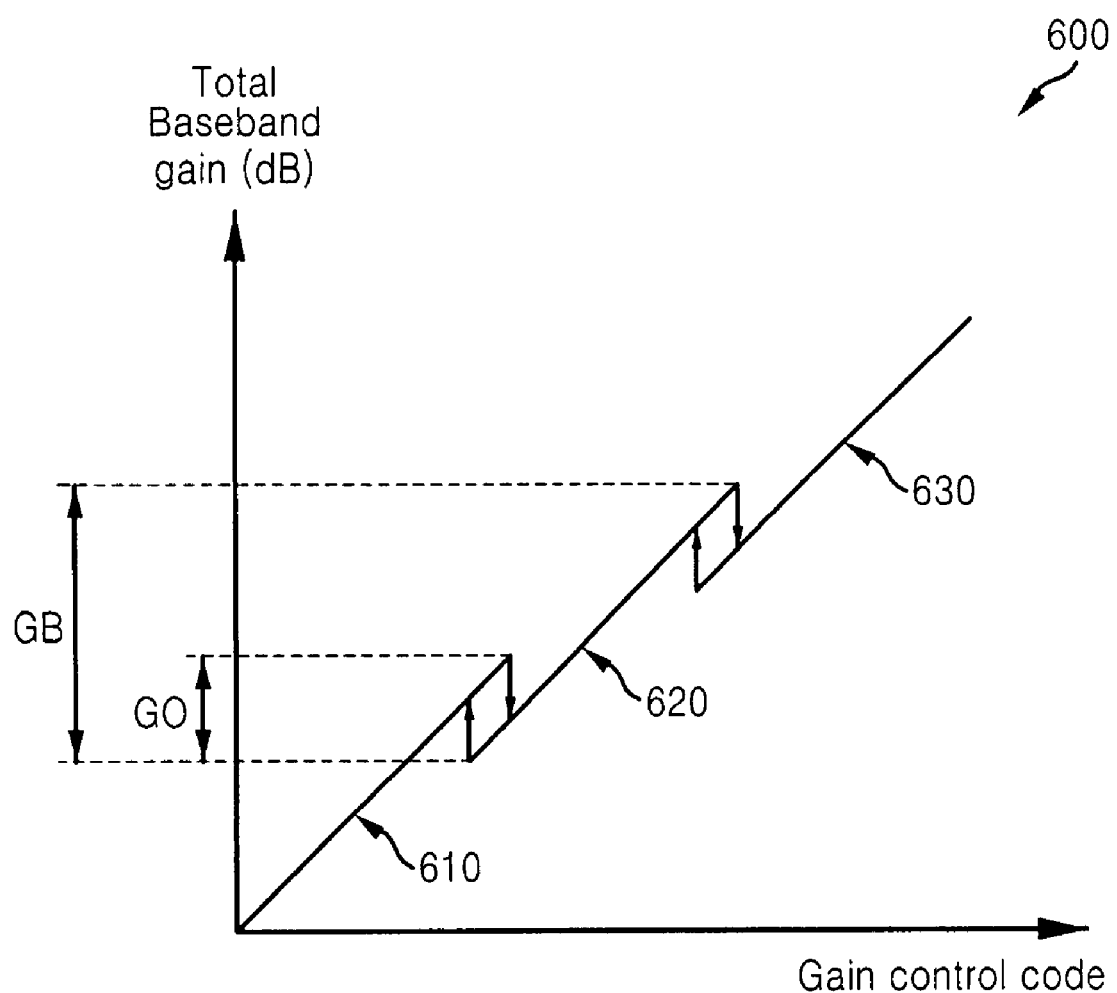
FIG. 6 is a graph of a gain characteristic for the analog baseband circuit of FIG. 4, according to an embodiment of the present invention.

FIG. 6 illustrates a total gain of the analog baseband circuit 200 versus the n-bit gain control code received by the gain controller 40. Note that the first gain step of the first PGA 421a is denoted by a gain band GB in FIG. 6. Thus, the first PGA gain of the first PGA 421a is changed in increments of the gain band GB in FIG. 6. In that case, the first PGA gain of the first PGA 421a is set to be within one of a first gain band 610, a second gain band 620, or a third gain band 630. Referring to FIGS. 4 and 6, the gain controller 40 sets an X-number of bits G1, G2, . . . , and GX to the first PGA 421a for setting the first PGA gain of the first PGA 421a.

The second PGA gain of the second PGA 421b and the third PGA gain of the third PGA 44 are set in smaller gain steps within the selected one of the gain bands 610, 620, and 630 set for the first PGA 421a. For example, if the n-bits gain control code is comprised of six-bits, then the two most significant bits of the six-bits gain control code with such significant binary weight are used to indicate the first PGA gain of the first PGA 421a. Thus, the first PGA 421a has the highest gain and the highest gain step among the PGAs 421a, 421b, and 44.

In addition, the two least significant bits of the six-bits gain control code with corresponding binary weight are used to indicate the third PGA gain of the third PGA 44. Thus, the third PGA 44 has the lowest gain and the lowest gain step. Furthermore, the middle two bits of the six-bits gain control code with corresponding binary weight are used to indicate the second PGA gain of the second PGA 421b. Thus, the second PGA 421b has an intermediate gain between the highest and lowest gains of the first and third PGAs 420a and 44, and has an intermediate gain step between the highest and lowest gain steps of the first and third PGAs 420a and 44.

With such decreasing gain and gain steps in the series of the PGAs 421a, 421b, and 44 from the input baseband signal "BB in" to the output baseband signal "BB out", the transient in the output baseband signal "BB out" is small for a gain change in the second and third PGAs 421b and 44. Thus, the low-pass filters 423a and 423b are not operated in the fast mode when a respective PGA gain is changed in the second PGA 421b or the third PGA 44.

However, because of the higher gain step in the first PGA 421a, a large transient occurs in the baseband output signal "BB out" when the first PGA gain of the first PGA 421a is changed. In that case, the analog baseband circuit 200 is desired to operate in the fast mode for a short time duration when the gain of the first PGA 421a is changed for quickly removing such a large transient.

Figure 5:
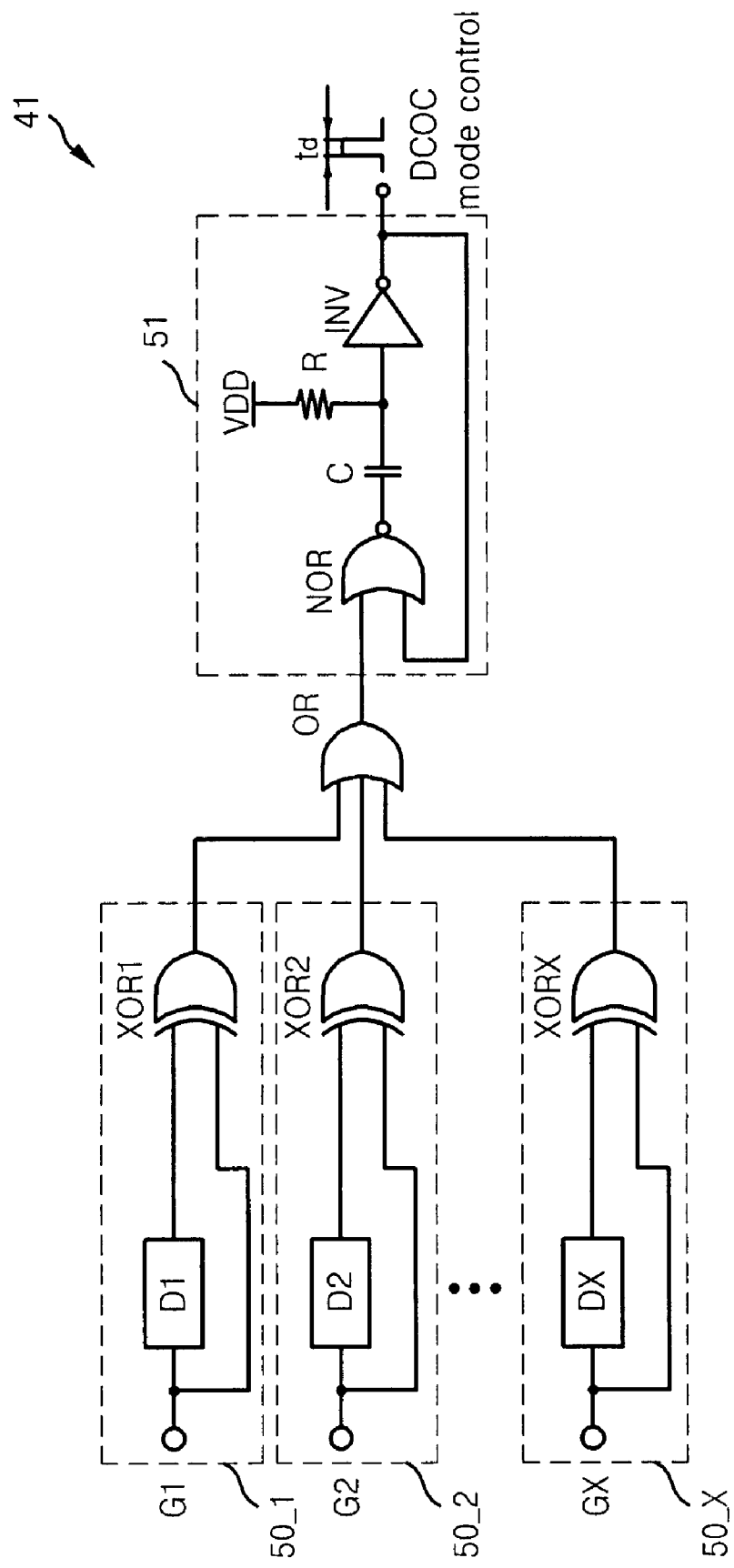
FIG. 5 is a circuit diagram of a DC offset cancellation (DCOC) controller in the analog baseband circuit of FIG. 4, according to an embodiment of the present invention.

FIG. 5 shows a circuit diagram of the DCOC controller 41 for generating a mode control signal for controlling the low-pass filters 423a and 423b to operate in such a fast mode when the gain of the first PGA 421a is changed. Referring to FIG. 5, the DCOC controller 41 includes X initial triggers 50_1, 50_1, . . . , and 50_X. Here, X is a natural number indicating the number of bits to the first PGA 421a. Such X-bits G1, G2, . . . , and GX are generated by the gain controller 40 to the first PGA 421a for setting the gain of the first PGA.

Each of the X initial triggers 50_1, 50_1, . . . , and 50_X performs an exclusive OR of a respective one of the X-bits G1, G2, . . . , and GX and its delayed version through a respective one of delay lines D1, D2, . . . , and DX. Thus, each of the X triggers 50_1, 50_1, . . . , and 50_X generates a respective trigger pulse if the respective one of the X-bits G1, G2, . . . , and GX changes (i.e., makes a transition). The outputs of the X initial triggers 50_1, 50_1, . . . , and 50_X are input to an OR gate that generates a pulse to a mono-stable trigger 51 if any of the X-bits G1, G2, . . . , and GX changes.

The mono-stable trigger 51 includes a NOR gate, a capacitor C, a resistor R, and an inverter INV. When the OR gate outputs a pulse, the time duration of such a pulse is set to a predetermined pulse duration "td" to generate a fast mode pulse at the output of the mono-stable trigger 51 depending on the capacitance of the capacitor C. The fast mode pulse with the pulse duration "td" is used as a control signal indicating fast mode operation to the first and second low-pass filters 423a and 423b.

The first and second cut-off frequencies of the first and second low-pass filters 423a and 423b are each increased for operation in the fast mode for the pulse duration "td" after any of the X-bits G1, G2, . . . , and GX to the first PGA 421a changes. Outside of the pulse duration "td", the first and second cut-off frequencies of the first and second low-pass filters 423a and 423b are each set to the usual lower frequencies for operation in the normal mode.

In this manner referring back to FIG. 6, the fast mode of operation is entered for the pulse duration "td" with change between the first and second gain steps 610 and 620 or with change between the second and third gain steps 620 and 630 for the gain of the first PGA 421a. Because of the large gain band GB, the fast mode is entered infrequently for reducing the instant deterioration of signal quality during the fast mode.

However, an AGC (automatic gain control) loop of the modem providing the n-bit gain control code may be locked near two gain codes at ends of the gain bands 610, 620, and 630 at which the GB of the PGA 421a changes. In that case, the gain band of the PGA 421a may change frequently from change of smaller gain steps near the ends of the gain bands 610, 620, and 630. Such frequent gain band changes would increase the number of conversions to the fast mode operation resulting in deterioration of signal quality.

To eliminate such signal deterioration, a gain overlap (GO) is set near the ends of the gain bands 610, 620, and 630. Thus, the same gain is maintained for a range of changes (i.e., for the gain overlap) of the n-bits gain control code according to a respective hysteresis (as indicated by the arrows in FIG. 6) near the ends of the gain bands 610, 620, and 630.

As a result, conversion to the fast mode is prevented from occurring frequently for the small positive and negative changes near the ends of the gain bands 610, 620, and 630. For example, assume that the baseband gain is 40 dB when the n-bit gain control code is "011111" and is 36 dB when the n-bit gain control code is "100000". In that case, a gain overlap of 4 dB is realized by the gain controller 40 that maintains the X-bits G1, G2, . . . , and GX without change to the first PGA 421a at both of such n-bit gain control codes "011111" and "100000".

In this manner, the number of mode conversions to the fast mode may be reduced even with rapid and quick gain changes in a multi-path fading environment. A large gain overlap GO decreases the number of mode conversions to the fast mode almost to zero but may decrease the performance of a receiver. Thus, such trade-offs are considered when setting the gain overlap GO.

While the present invention has been particularly shown and described with reference to exemplary embodiments thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:

1. An analog baseband circuit comprising:
   a first DC (direct current) offset canceller having a first filter and a first PGA (programmable gain amplifier) with a first gain step for eliminating a first dc component from an input baseband signal;
   a second DC offset canceller having a second filter and a second PGA with a second gain step less than the first gain step for eliminating a second dc component from an output of the first DC offset canceller; and
   an offset canceller controller for controlling the first and second filters to operate in a fast mode when a gain of the first PGA is changed.

2. The analog baseband circuit of claim 1, wherein the first DC offset canceller includes a first feed-back loop comprising:
   a first low-pass filter that is said first filter for low-pass filtering a first PGA output according to a first cut-off frequency to generate a first filtered output;
   a first feed-back amplifier for amplifying the first filtered output; and
   a first subtractor for subtracting the amplified first filtered output from the input baseband signal to generate a first DC offset cancelled baseband signal;
   wherein the first PGA amplifies the first DC offset cancelled baseband signal with a first PGA gain to generate the first PGA output.

3. The analog baseband circuit of claim 2, wherein the second DC offset canceller includes a second feed-back loop comprising:
   a second low-pass filter that is said second filter for low-pass filtering a second PGA output according to a second cut-off frequency to generate a second filtered output;
   a second feed-back amplifier for amplifying the second filtered output; and
   a second subtractor for subtracting the amplified second filtered output from a form of the first PGA output to generate a second DC offset cancelled baseband signal;
   wherein the second PGA amplifies the second DC offset cancelled baseband signal with a second PGA gain to generate the second PGA output.

4. The analog baseband circuit of claim 3, wherein the offset canceller controller increases the first and second cut-off frequencies of the first and second low-pass filters when the first PGA gain is changed.

5. The analog baseband circuit of claim 3, further comprising:
   a gain controller for setting the first and second PGA gains according to an n-bit gain control code.

6. The analog baseband circuit of claim 5, wherein the gain controller sets the first and second PGA gains to obtain a respective gain overlap near each end of a gain band for the first PGA in a gain characteristic of the analog baseband circuit.

7. The analog baseband circuit of claim 5, wherein a subset of at least one most significant bit of the n-bit gain control code determines the first PGA gain, and wherein the offset canceller controller includes:
   a respective initial trigger for generating a respective trigger pulse when a respective one of said subset of the n-bits changes; and
   a mono-stable trigger for generating a fast mode pulse from any respective trigger pulse such that the first and second low-pass filters operate with an increase of the first and second cut-off frequencies during the fast mode pulse.

8. The analog baseband circuit of claim 3, further comprising:
another low-pass filter coupled between the first and second low-pass filters for low-pass filtering the first PGA output to generate a filtered first PGA output to the second subtractor that subtracts the amplified second filtered output from the filtered first PGA output to generate the second DC offset cancelled baseband signal.

9. The analog baseband circuit of claim 3, further comprising:
a third PGA with a third gain step less than the second gain step for amplifying the second PGA output to generate an output baseband signal.

10. The analog baseband circuit of claim 1, wherein the analog baseband circuit is used within a direct conversion receiver of a communications system.

11. A method of eliminating DC offset from an input baseband signal, comprising:
eliminating a first dc component from the input baseband signal with a first feed-back loop having a first filter and a first PGA (programmable gain amplifier) with a first gain step;
eliminating a second dc component from a first PGA output with a second feed-back loop having a second filter and a second PGA with a second gain step less than the first gain step; and
controlling the first and second filters to operate in a fast mode when a gain of the first PGA is changed.

12. The method of claim 11, further comprising:
low-pass filtering the first PGA output according to a first cut-off frequency to generate a first filtered output;
amplifying the first filtered output; and
subtracting the amplified first filtered output from the input baseband signal to generate a first DC offset cancelled baseband signal;
wherein the first PGA amplifies the first DC offset cancelled baseband signal with a first PGA gain to generate the first PGA output.

13. The method of claim 12, further comprising:
low-pass filtering a second PGA output according to a second cut-off frequency to generate a second filtered output;
amplifying the second filtered output; and
subtracting the amplified second filtered output from a form of the first PGA output to generate a second DC offset cancelled baseband signal;
wherein the second PGA amplifies the second DC offset cancelled baseband signal with a second PGA gain to generate the second PGA output.

14. The method of claim 13, further comprising:
increasing the first and second cut-off frequencies of the first and second low-pass filters when the first PGA gain is changed.

15. The method of claim 13, further comprising:
controlling the first and second PGA gains according to an n-bit gain control code.

16. The method of claim 15, further comprising:
setting the first and second PGA gains to obtain a respective gain overlap near each end of a gain band for the first PGA in a gain characteristic of the analog baseband circuit.

17. The method of claim 16, further comprising:
setting the first and second PGA gains according to a hysteresis defined by the respective gain overlap near each end of the gain band.

18. The method of claim 15, wherein a subset of at least one most significant bit of the n-bit gain control code determines the first PGA gain, and wherein the method further comprises:
generating a respective trigger pulse when a respective one of said subset of the n-bits changes; and
generating a fast mode pulse from any respective trigger pulse such that the first and second low-pass filters operate with an increase of the first and second cut-off frequencies during the fast mode pulse.

19. The method of claim 13, further comprising:
low-pass filtering the first PGA output to generate a filtered first PGA output; and
subtracting the amplified second filtered output from the filtered first PGA output to generate the second DC offset cancelled baseband signal.

20. The method of claim 13, further comprising:
amplifying the second PGA output with a third PGA having a third gain step less than the second gain step to generate an output baseband signal.

* * * * *